United States Patent
Olson et al.

[11] Patent Number: 6,083,855
[45] Date of Patent: Jul. 4, 2000

[54] METHODS OF MANUFACTURING VOIDLESS RESIN IMPREGNATED WEBS

[75] Inventors: Larry D. Olson, Viroqua, Wis.; John R. Wold, Brownsville, Minn.; Dave F. Miller, Trempealleau, Wis.; Marc Hein, Onalaska, Wis.; Mary Jo Theyerl; Edward Hammes, both of LaCrosse, Wis.

[73] Assignee: Isola Laminate Systems Corp., LaCrosse, Wis.

[21] Appl. No.: 09/224,991

[22] Filed: Jan. 4, 1999

[51] Int. Cl.[7] .................................................. B32B 17/02
[52] U.S. Cl. ...................... 442/180; 442/175; 428/307.3; 428/308.4; 427/434.2; 427/434.4; 427/434.6; 427/294
[58] Field of Search .............................. 427/434.2, 434.4, 427/434.6, 294; 428/307.3, 308.4; 442/175, 180

[56] References Cited

U.S. PATENT DOCUMENTS

| | | | |
|---|---|---|---|
| 4,229,473 | 10/1980 | Elber | 428/113 |
| 4,307,755 | 12/1981 | Schmidt et al. | 138/38 |
| 4,510,008 | 4/1985 | Hoshi et al. | 156/245 |
| 4,767,643 | 8/1988 | Westervelt et al. | 427/54.1 |
| 5,037,691 | 8/1991 | Medney et al. | 428/137 |
| 5,166,037 | 11/1992 | Atkinson et al. | 430/315 |
| 5,508,328 | 4/1996 | Olson | 523/445 |
| 5,512,224 | 4/1996 | Medney et al. | 264/102 |
| 5,534,565 | 7/1996 | Zupancic et al. | 523/454 |
| 5,620,789 | 4/1997 | Gan et al. | 442/59 |
| 5,969,059 | 10/1999 | Murai et al. | 525/506 |

*Primary Examiner*—Elizabeth M. Cole
*Assistant Examiner*—Arti R. Singh
*Attorney, Agent, or Firm*—McDonnell Boehnen Hulbert & Berghoff

[57] ABSTRACT

A method for manufacturing a cured resin impregnated substrate comprising placing a substrate into a impregnation zone including a solvent containing curable resin to produce a resin impregnated substrate and at least partially curing the resin impregnated substrate to produce a cured resin impregnated substrate, wherein the number of voids in the cured resin impregnated substrate are reduced by processing the substrate in at least one processing step that reduces the number of voids in the cured resin impregnated substrate product.

21 Claims, 4 Drawing Sheets

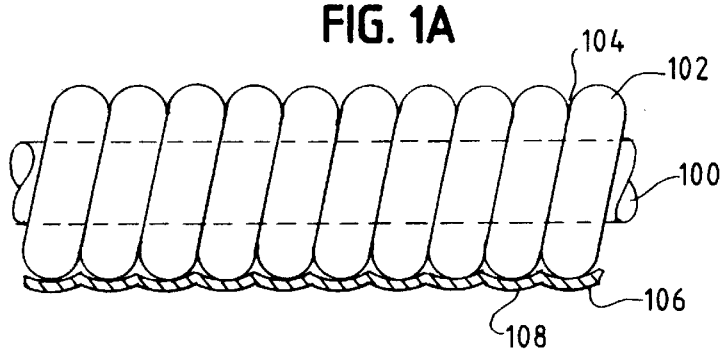
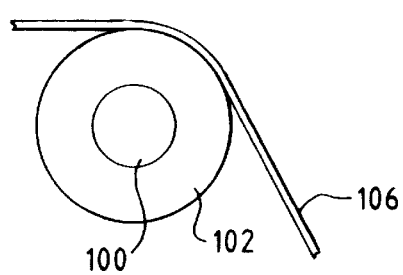
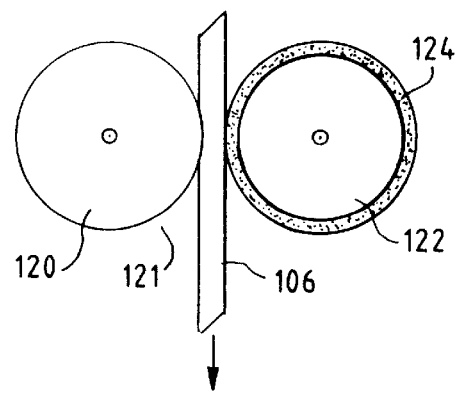
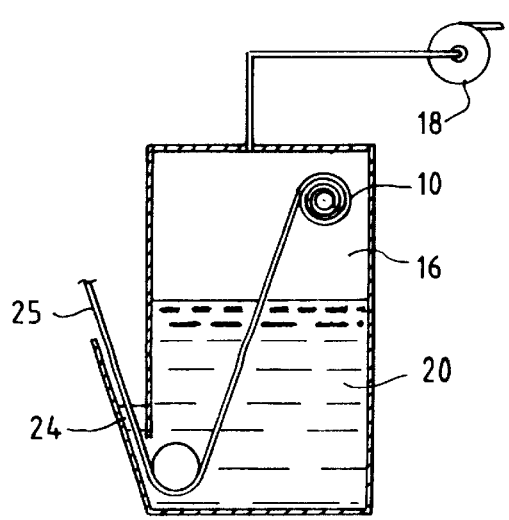
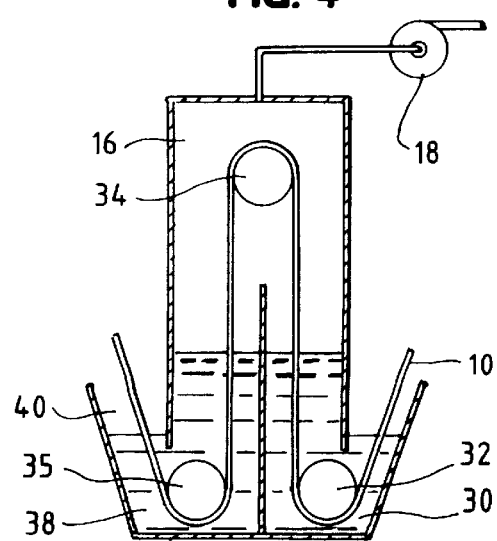

METHODS OF MANUFACTURING VOIDLESS RESIN IMPREGNATED WEBS

BACKGROUND OF THE INVENTION

(1) Field of the Invention

This invention concerns a method for manufacturing a reduced void laminate by applying a curable resin to a fibrous substrate and by subjecting the substrate, the resin, or a combination thereof to one or more process steps that reduce the number voids in the cured resin filled substrate.

(2) Description of the Art

Advanced composites comprising reinforcing fibers and matrix resins have become indispensable constituents in heterogeneous structures such as laminates used for printed circuit boards and other electronic components. One particular useful class of advanced composites are laminates manufactured using resin reinforced fibers. Typically, a fibrous material is impregnated with a curable resin compound after which the combination is cured to form a laminate material.

Advancements in laminate manufacturing procedures as well as the resins and reinforcing materials used in the laminates have resulted in laminate products that are made quickly and efficiently and with a high degree of strength and reliability. However, because the laminates are typically prepared by impregnating a fibrous reinforcement material with a liquid resin compound at high speed, it is typical for the cured laminate to include voids such as small air pockets in the fiber bundles and in the intersticial spaces between the fiber bundles. Therefore, there remains a need for new laminate manufacturing processes that are capable of operating at high throughput to produce high quality resin impregnated fiber laminates having essentially no voids.

SUMMARY OF THE INVENTION

It is an object of this invention to provide a method for manufacturing a resin impregnated substrate that includes a processing step or steps that reduces the number of voids in the prepreg and in the cured product.

It is another object of this invention to provide a method for manufacturing prepreg and/or laminate product comprising a cured resin impregnated substrate that includes essentially no voids.

Still another object of this invention includes a process for manufacturing an essentially void free prepreg and/or laminate at a high throughput and at a low cost.

In one embodiment, this invention includes a method for manufacturing a cured resin impregnated substrate. The method comprises placing a substrate into a dip pan including a solvent containing curable resin to give a resin impregnated substrate and at least partially curing the resin impregnated substrate to give a cured resin impregnated substrate. The number of voids in the cured resin impregnated substrate are reduced by processing the substrate by at least one process step selected from (1) using a solvent containing curable resin having a relatively low solids content; (2) dipping the resin impregnated substrate into a second impregnation zone including a solvent containing curable resin having relatively high solids content; (3) mechanically manipulating the substrate before impregnation, after the first dip pan, and in first/second dip pans; (4) heating the substrate prior to placing the substrate into the first impregnation zone; (5) heating the solvent containing resin; (6) heating the impregnated wet web between two dip pans; and (7) vacuum impregnation of the glass with resin.

In another embodiment, this invention includes a method for manufacturing a cured resin impregnated substrate by placing a substrate into a impregnation zone including a solvent containing curable resin to give a resin impregnated substrate and thereafter at least partially curing the resin impregnated substrate to give a cured resin impregnated substrate. A further step of the method is forming a partial vacuum in the impregnation zone.

In still another embodiment, this invention includes cured resin impregnated substrates that are essentially void free and that are preferably void free.

DESCRIPTION OF THE FIGURES

FIGS. 1A and 1B are front and side cross section views respectively of a Meir rod associated with a substrate for use in one embodiment of the present invention;

FIG. 2 is a side view illustrating a method for use in another embodiment of this invention for mechanically manipulating a substrate;

FIG. 3 is a diagram of a process for manufacturing a resin impregnated substrate in accordance with yet another embodiment of this invention that includes a single impregnation zone;

FIG. 4 is a diagram of a process for manufacturing a resin impregnated substrate in accordance with still another embodiment of this invention that includes a first impregnation zone and a second impregnation zone.

DESCRIPTION OF THE CURRENT EMBODIMENT

Figure 5A:
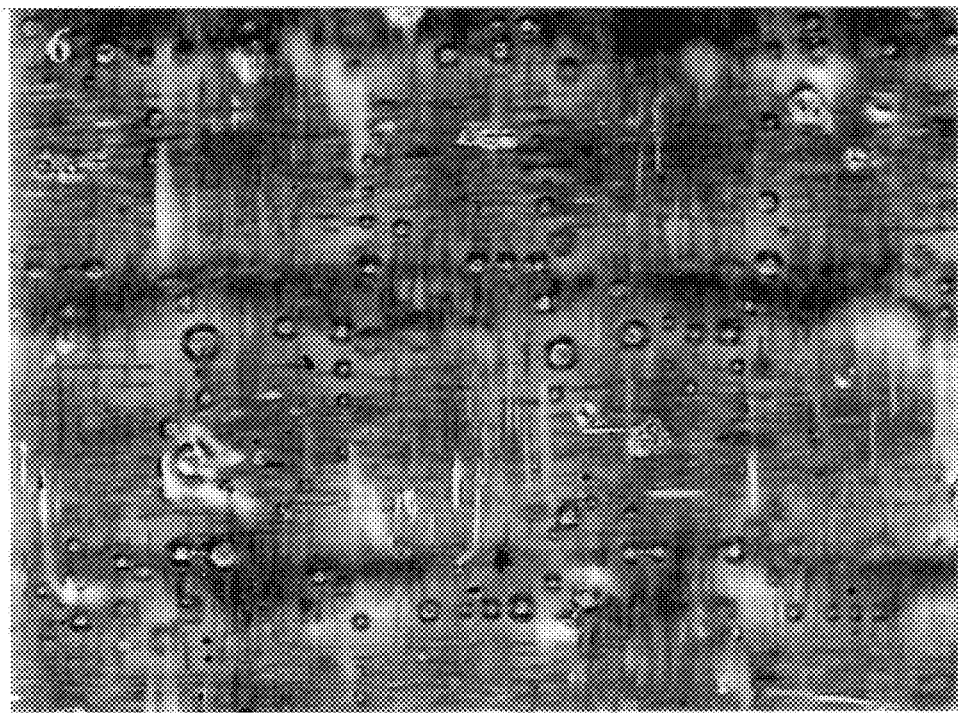
FIGS. 5A–5F are photographs of cross sections of laminates produced according to Example 1 at 0, 5, 10, 15, and 25 in/Hg.

The present invention relates to a process for manufacturing reinforced resin impregnated prepregs and laminates which include at least one process step that reduces the number of voids in the cured product. More specifically, the process steps which may be selected to reduce the number of voids in the final product include; (1) using a solvent containing curable resin having a relatively low solids content; (2) dipping the resin impregnated substrate into a second impregnation zone including a solvent containing curable resin having relatively high solids content; (3) mechanically manipulating the substrate before impregnation, after the first dip pan, and in first/second dip pans; (4) heating the substrate prior to placing the substrate into the first impregnation zone; (5) heating the solvent containing resin; (6) heating the impregnated wet web between the two dip pans; and (7) vacuum impregnation of the glass with resin. This invention also includes cured resin impregnated prepreg and laminate materials that are essentially void free and that are produced by processes that incorporate one or more of the process steps and/or process modifications of this invention.

For purposes of this invention, the term "fibrous substrate" and "substrate" are used interchangeably to refer to fibrous reinforcing materials of the kind are typically used to manufacture laminates useful in circuit boards including, but not limited to woven or nonwoven cloths or fibers such as fiberglass, E-glass, quartz, paper, aramid, PTFE, S-glass, D-glass, or similar reinforcing materials. A preferred fibrous substrate is E-glass.

For purposes of this invention, the term "resin" refers to one or more polymer systems including curable polymers, solvents, as well as any other materials and additives that are typically added to curable polymers to provide strength, durability, heat resistance, water resistance and so forth to prepregs and to laminates. Some examples of ingredients useful in resin systems include solvents, chain extenders, curing agents, catalysts, reactivity controllers and so forth. Examples of resin systems useful in conjunction with the process of this invention are described in U.S. Pat. Nos. 5,508,328, 5,620,789, 5,534,565 and U.S. Provisional Patent Application Ser. No. 60/019,853 each of which are incorporated herein by reference. Resin impregnated substrates prepared according to the processes of this invention are useful in preparing metal clad laminates, housings and other articles that are useful in the manufacture of electronic circuits, integrated circuit housings, circuit boards and so forth.

Cured resin impregnated substrates, also known as prepregs and/or laminates, are most often produced on machines called treaters. The treaters typically include fibrous substrate feed rollers, a resin impregnation tank, a treater or curing oven, and cured substrate receiving rollers. Reinforced fibrous materials such as glass fibers are usually supplied in the form of a large spool. The spool is put on a feeder roller which turns slowly to roll a continuous web of glass fibers from the roll. The glass fiber web moves through the resin in the resin impregnation tank. After emerging from the tank, the resin impregnated glass moves upwards at speeds ranging from 10 to 100 feet per minute to a treater oven which typically operates at about 200–300° F. At the base of the treater oven is a set of rollers that the impregnated glass passes between. The gap setting between the two rollers determines the amount of resin that will be coated onto the glass. In the treater, the resin wets the glass and solvent in the resin is boiled away at which point the resin begins to polymerize. When the material emerges from the tower it is at least partially cured to an extent that is not wet or tacky. However, the cure process is typically stopped short of completion so that additional curing can occur when the final laminate is made. The laminate then may be associated with one or more sheets of conductive metal to give metal clad laminates. A preferred metal cladding is copper. The metal clad laminates may then be processed using conventional circuit board processing techniques to apply circuit traces to the laminate surfaces. In addition, the circuit board layers may be laminated if desired to form multilevel circuit boards.

The standard reinforced resin laminate manufacturing method described above typically produces laminate materials with voids between the substrate fiber filaments in each fiber bundle as well as voids located in the interstitial spaces between bundles of fibers. It is an aspect of this invention to provide one or more process improvements to the laminate method manufacturing described above which results in a reduced void laminate product. The process improvements of this invention can be generally divided into three categories; (1) process steps that are preformed prior to impregnating the fibrous substrate with resin; (2) process steps that are performed during impregnation of a substrate with a resin; and (3) process steps that are performed after a substrate has been impregnated with a resin.

I. Substrate Pretreatment Steps

A. Substrate Drying

A pretreatment process step that reduces laminate voids is drying the fibrous substrate prior to impregnating the substrate with one or more resin compounds. The substrate drying temperature and time will vary depending upon the substrate used. A preferred substrate material is woven glass cloth. The woven glass cloth is typically supplied in rolls. The entire roll can be dried before use or the woven glass cloth can be dried as it is unwound before resin impregnation. The preferred woven glass substrate may be dried at a temperature of from 150 to about 500° F. When dried unwound from the roll, the drying time ranges from about 1 minute to about 10 minutes or more. It is most preferred that an unwound woven glass cloth substrate is dried at a temperature of from about 200 to about 350° F. for a period of time ranging from about 1 minute to about 5 minutes. If this drying is done in roll form it will take up to 1 hour or more to remove the moisture from the roll. Drying the substrate prior to resin impregnation improves the wetability of the substrate thereby reducing the number of voids in the final laminate product.

B. Substrate Mechanical Manipulation

A second substrate treatment step that reduces the number of voids in the final laminate product is mechanical manipulation of the substrate. One purpose of substrate manipulation, and especially manipulation of glass fiber substrates, is to interfere and preferably break any encapsulation, binding or seal among the filaments that make up a fiber bundle. Breaking the encapsulated filament bundles facilitates penetration of the resin throughout the entire woven glass substrate.

Substrates may be mechanically or chemically manipulated using any method that is capable of interfering with the encapsulation of fiber filaments or fiber filament bundles. Examples of useful manipulation methods include passing a substrate past an air knife, treating a substrate ultrasonically, passing a substrate between two rollers, and passing a substrate over a non-uniform surface such as a Meir rod. Preferred methods of interrupting the filament or fiber bundle encapsulation include passing the substrate over a non-uniform surface such as a Meir rod or pressing the substrate between rollers.

Meir rods are rods that are tightly wound with a wire material to form a non-uniform surface across the rod. FIGS. 1A and 1B are a front view and side cross section views respectively of a Meir rod associated with a fiber substrate. The Meir rod includes a central rod 100 surrounded by a wire winding 102. The wiring winding forms non-uniformities or gaps 104 on the rod surface. When substrate 106 is passed across the Meir rod, small arcs 108 are formed in the substrate 106. Forming arc 108 causes fibrous substrate 106 to stretch and stress which mechanically interferes with encapsulated filaments. As shown in FIG. 1B, it is preferred that substrate 106 passes across the Meir rod at an angle. Passing substrate 106 across the Meir at an angle ensures that substrate 106 is drawn tightly against the Meir rod in order to facilitate the formation of arcs 108.

While it is preferred that Meir rods are used to mechanically stress the substrate, the substrate may be passed across any non-uniform surface that causes the fibrous substrate to form arcs, peaks, valleys or any other surface defamation that stresses the encapsulated filaments. Passing the substrate at an angle across an angled surface would fall within the scope of a non-uniform surface.

Another method of mechanically manipulating the substrate is by passing the substrate between two rollers as depicted in FIG. 2. First roller 120 will typically have a hard smooth surface 121. Second roller 122, will typically have a surface that is softer than first roller surface 121 such as a rubberized surface 124. Substrate 106 is mechanically manipulated by the rollers by passing it between first roller 120 and second roller 122. A gap between the rollers is set at a width that forces rubberized surface 124 of second roller 122 to press substrate 106 against surface 121 of first roller 129 thereby causing substrate 106 to form a slight arc in order to conform with the non-planar surface 121 of first roller 120. Forcing the substrate sheet 106 into an arch stresses the encapsulated filaments and thereby renders the substrate more amiable to voidless resin impregnation.

The substrate may be mechanically manipulated using the mechanical methods identified above at any time during the substrate manufacturing process including prior to resin impregnation, in between resin impregnation steps, and after resin impregnation is complete. It is preferred that the mechanical or chemical manipulation is performed on the substrate when the substrate has been wetted with resin most preferably the substrate will be mechanically manipulated after a first resin impregnation step and before a second resin impregnation step.

II. Impregnation Zone Modifications

We have discovered several process modifications that can be incorporated into the resin impregnation step to reduce laminate voids. One of the process modifications involves improving the resin solution formulation. Other useful process modifications include heating the resin solution, passing the substrate through multiple resin solutions with drying between impregnations, mechanically manipulating the resin impregnated glass substrate, and increasing the substrate dwell time in the resin solution.

A. Low Solids Resin Solution

We have discovered that the resin solutions solid content is very important in reducing laminate voids. More specifically we have determined that resin solutions containing less than about 80 wt % solids, more preferably less than about 50 wt % solids, and most preferably from 10 to 30 wt % solids are very useful in reducing laminate voids. The terms "solids" or "solids content" are used herein to refer to the nonsolvent weight portion of materials in the resin containing solution into which a substrate is dipped. Lowering the solids content of resin solutions effectively increases the solvent content of the same solutions and improves penetration of the resin in the substrate. The improvement in resin penetration into the substrate has the corollary effect of reducing laminate voids.

In order to improve laminate manufacturing efficiency, it can be useful to subject the substrate to more than one impregnation step. When two or more impregnation steps are used, the resin solutions used in the impregnation steps may have the same solids content or different solids content. Furthermore, when two or more impregnation steps are used, the first impregnation step can consist of dipping the substrate into a solvent solution followed by a second impregnation step in which the substrate is placed in a resin containing impregnation solution. It is preferred that the resin solution solids contents are sequentially increased in each impregnation zone when two or more impregnation steps are used. By subjecting the substrate to multiple resin impregnations, the initial resin impregnation can be performed in a low solids content resin solution to achieve good wetting of the fibrous substrate. Following the first impregnation step, solvent is preferably removed from the substrate after which the substrate is placed in a second impregnation solution including a higher resin solids content than in the first impregnation solution. The higher resin solids content in the second impregnation solution facilitates the impregnation of the fibrous substrate with the desired amount of resin. When multiple impregnation steps are used, the first impregnation zone should include a resin having a solids content less than the solids content of the resin solution in the second impregnation zone. The resin solutions solids contents in either impregnation zone may range from about 1 to about 90 wt %. However, when multiple impregnation steps are used, it is preferred that the first impregnation zone has a resin solid content of from about 5 to 80 wt %, more preferably from about 5 to about 50 wt %, and most preferably from about 10 to about 30 wt %.

B. Resin solvent

The choice of resin solvent can be important in reducing laminate voids. In order to reduce laminate voids, the solvent should be easily removed from the impregnated substrate. Furthermore, the solvent used should facilitate resin penetration into the substrate and substrate wetout time. Examples of solvents that can be combined with a resin into a resin solution that reduces laminate voids are acetone, N-methyl pyrrillodone, PM (propylmonomethylether), PM acetate (propylmonomethylether acetate), DMF (dimethylformaide), acetone, methanol, MEK, and combinations thereof. A preferred resin solution is a combination of DMF and acetone. The DMF/acetone mixture preferably ranges from about 1 part DMF to 3 parts acetone to 3 parts DMF to 1 part acetone. A most preferred solvent is about a mixture of 1 to 1 weight ratio mixture of DMF and acetone.

C. Resin Solution Heating

Several resin impregnation processing step improvements can reduce substrate voids. One processing improvement is heating one or more of the resin solutions during substrate impregnation. Heating resin solutions enhances the substrate wetout and it also improves resin penetration into the substrate. The temperature to which a resin solution is heated will vary depending upon the resin selected and upon the solvent or combination of solvents used. It is preferred that the resin solution is heated to a temperature of from 80° to 140° F. and preferably from about 100 to about 120° F. Typically the resin solution should not be heated to a temperature greater than about 150° F.

D. Intermediate Substrate Heating

Another method of using heat to decrease laminate voids involves heating the resin impregnated substrate between resin impregnation steps. Heating a resin impregnated substrate enhances the substrate wet out time and permeability. The resin impregnated substrate should be heated after it is withdrawn from a resin solution. The resin impregnated substrate may be heated between impregnations when multiple impregnation steps are used, and it must be heated following the final impregnation step. The temperature to which the resin impregnated substrate is heated will vary depending upon the resin and solvent system used. The resin impregnated substrate may be heated from a temperature above room temperature (about 100° F.) to about 400° F. However, it is preferred that the resin impregnated substrate is heated to a temperature of from about 150 to about 375° F. and most preferably to a temperature of about 200 to about 350° F.

It is preferred that the resin saturated fibrous substrate undergoes two or more resin impregnation steps. Heating the resin impregnated substrate between impregnation steps increases the amount of resin that is required to saturate the resin containing fibrous substrate and thereby increases the amount of resin that can be accepted by the resin impregnated substrate in the second and subsequent impregnation steps.

E. Maximizing Dwell Time

The dwell time is the time starting when the resin impregnated substrate enters the first resin impregnation vessel and ending when the resin impregnated substrate enters the oven. Maximizing dwell time facilitates the ability of the resin impregnated fiber substrate to accept additional resin and solvent. It is preferred that the resin impregnated substrate dwell time ranges from about 30 seconds to about 10 minutes or more. It is most preferred that the dwell time ranges from about 1 to about 4 minutes.

III. Vacuum Impregnation

A processing method that is useful for reducing and in eliminating laminate voids altogether is vacuum impregnation. An important feature of the vacuum impregnation process of this invention is insuring that the substrate enters at least one impregnation solution under vacuum and that it exits an impregnation solution at a pressure higher than the impregnation solution entry pressure. Thus, the impregnation solution exit pressure may be at a vacuum pressure higher (nearer atmospheric pressure) than the impregnation solution entry pressure, it may be at ambient pressure, or the impregnation zone exit pressure may be in excess of ambient pressure. Maintaining a positive differential pressure across the impregnation zone facilitates substrate wetout and impregnation of the substrate with solvent and/or resin. The end result is fewer voids in the resulting laminate and preferably, an essentially void free laminate.

The differential pressure across the vacuum impregnation zone should be at least 5 in/Hg. It is more preferred that the differential pressure across the vacuum impregnation zone is at least 15 in/Hg, and is most preferred that the differential pressure across the vacuum impregnation zone is at least 20 in/Hg.

FIGS. 3 and 4 depict processes of this invention including single and multiple impregnation zones that are operated with a differential pressure across the impregnation zone. The primary difference between the process is that FIG. 3 depicts a process including a single resin impregnation zone while FIG. 4 depicts a process including at least two separate impregnation zones.

According to FIG. 3, a roll of substrate 10 is located in vacuum chamber 16. A vacuum is drawn on vacuum chamber using vacuum pump 18. The roll of substrate is unwound and the fibrous substrate web enters impregnation zone 20 under vacuum pressure. Impregnation zone 20 will typically include a resin/solvent solution having a solvent content from 10 to 90 wt % and preferably having a reduced solid content. Once fibrous substrate 10 becomes impregnated with the resin solution, it is directed by roller 22 out of impregnation zone 20. The use of a partial vacuum in impregnation zone 20 removes air from the fibers of the fibrous substrate to facilitate improved solvent and resin penetration.

FIG. 4 depicts a vacuum impregnation process similar to that depicted in FIG. 3 except there are at least two impregnation zones in the process of FIG. 4. According to FIG. 4 fibrous substrate 10 enters first impregnation zone 30 and is directed by roller 32 towards roller 34. Roller 32 is located in first impregnation zone while roller 34 is located in vacuum chamber 16. As in FIG. 3, air is removed from fibrous substrate 10 in vacuum chamber 16 to enable improved resin penetration into substrate 10. However, the reduced pressure in vacuum chamber 16 causes the solvent in the fibrous substrate to at least partially vaporize, then, when the substrate encounters increasing pressure. The vaporized solvent at least partially condenses thereby drawing resin into the fibers of the fibrous substrate. Roller 34 directs the substrate towards roller 35 which is located in second impregnation zone 38. Roller 35 also directs the substrate out to the outlet 40 of second impregnation zone 38.

When two or more impregnation zones are used, first impregnation zone may include a solution that consists entirely of a solvent or it may include a solvent/resin combination solution. The solution in the second impregnation zone will typically include a solvent/resin combination solution. It is preferred that when both the first and second impregnation zones include a solvent/resin combination solution that the solids content of the solution in the first impregnation zone is less than the solid content of the solution in the second impregnation zone. As stated above, when two impregnation zones are used, the solvent in the substrate at least partially vaporizes between impregnation zones. As the pressure on the substrate increases in the second impregnation zone, the solvent at least partially condenses drawing resin into the substrate fibers.

Additional processing steps such as those disclosed above which reduce laminate voids may also be incorporated into the vacuum impregnation steps set forth in FIGS. 1 and 2 in the accompanying specification. For example, the solutions in the first and second impregnation zones may be heated, the fibrous substrate may be heated between impregnation steps, the fibrous substrate may be mechanically manipulated prior to entering any impregnation zone or exiting the final impregnation zone, and so forth.

EXAMPLE 1

This Example evaluated the reduction of laminate voids resulting from impregnating a fibrous substrate with a resin solution of vacuum. Glass samples designated as 7628 and manufactured by Clark Schweibel were placed in a vacuum chamber and brought to the desired level of vacuum. Under vacuum, the glass sample was dipped into acetone for about 5 seconds removed and allowed to dry for about 30 seconds to 1 minute at 70° F. Following drying, the dried glass sample was placed in a resin solution under vacuum conditions. The resin solution used for all experiments was Grade 406 manufactured by AlliedSignal Laminate Systems Inc. The glass sample was allowed to remain in the resin solution for about 15 to about 30 seconds after which the vacuum was released from the system and the pressure was returned to ambient. After ambient pressure was reached, the resin impregnated glass sample was removed from the resin and cured for a period of time ranging from about 2–3 minutes in an oven set at 350° F.

Figure 5B:
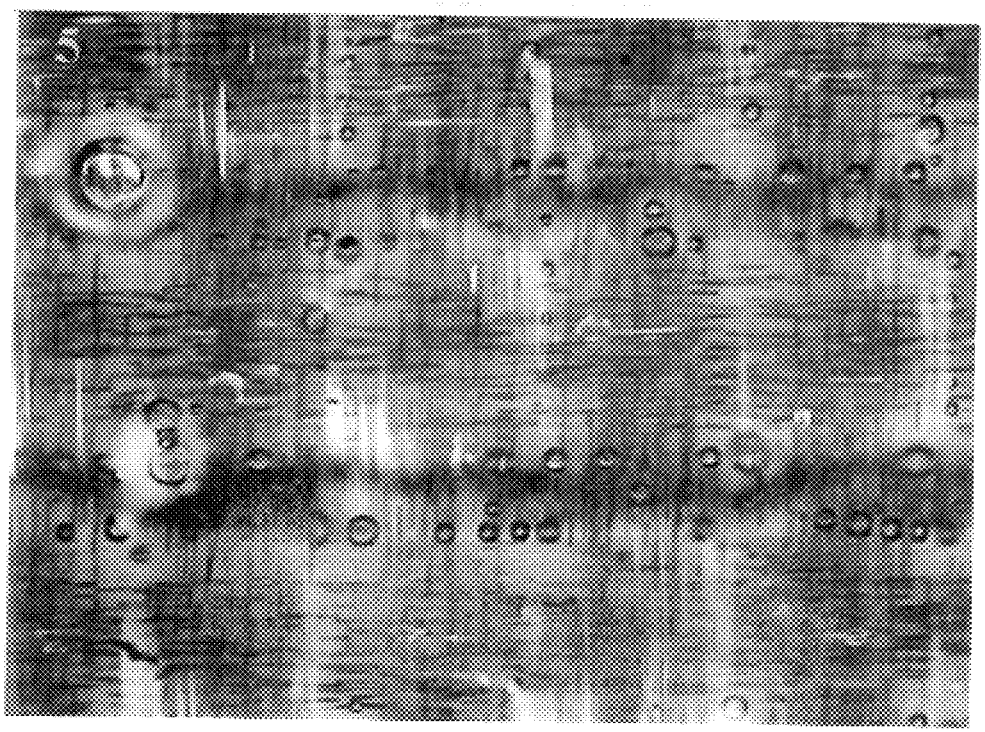
Figure 5C:
Figure 5D:
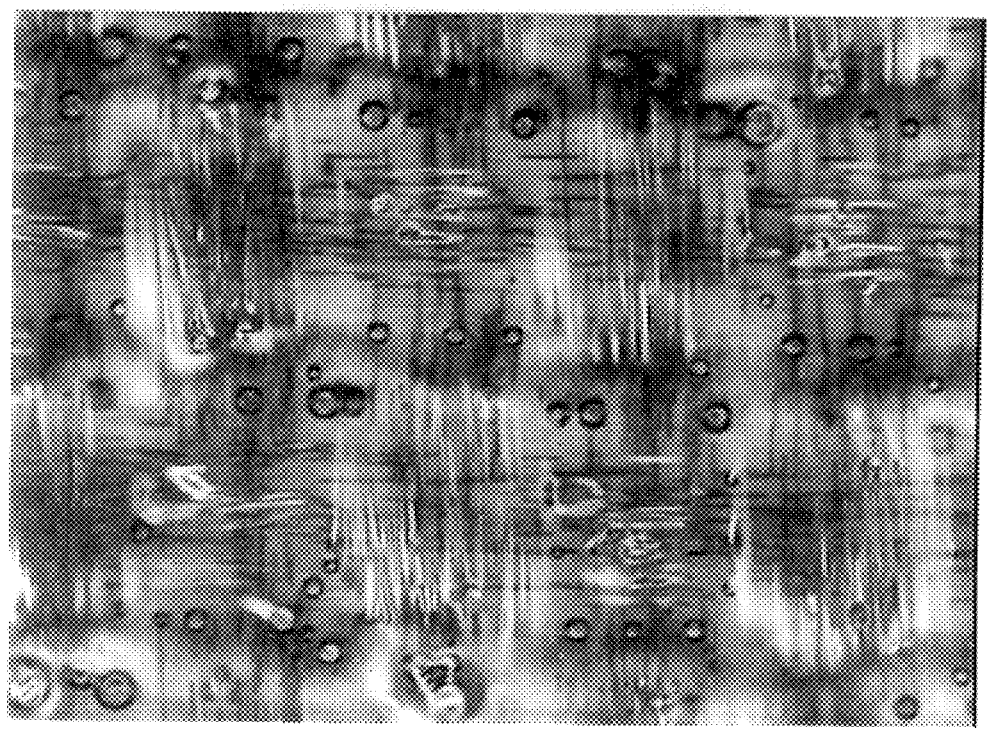
Figure 5E:
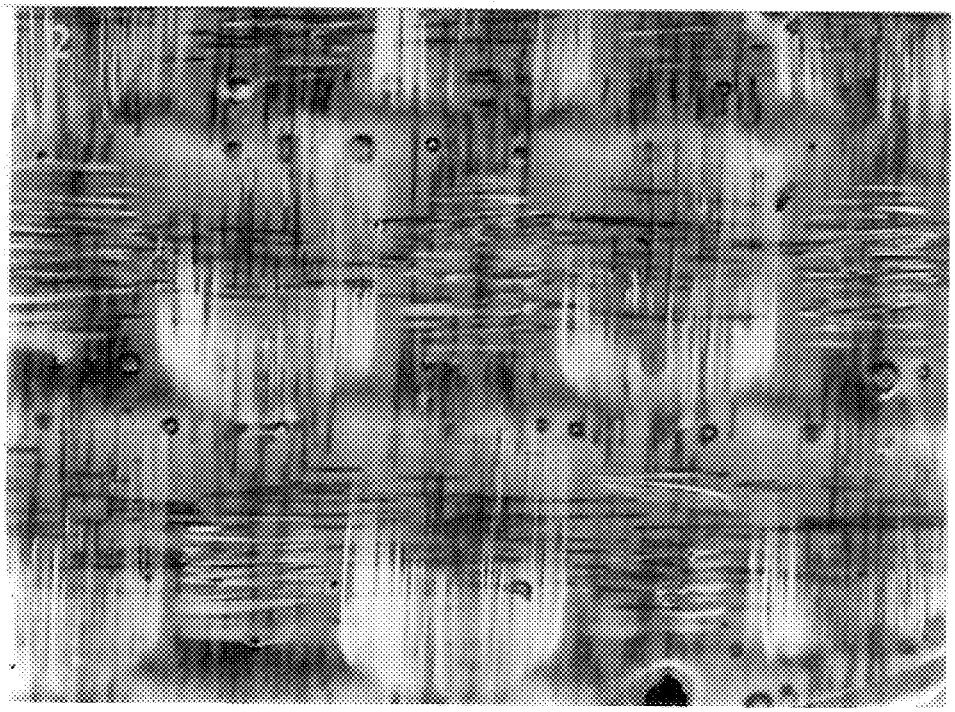
Figure 5F:
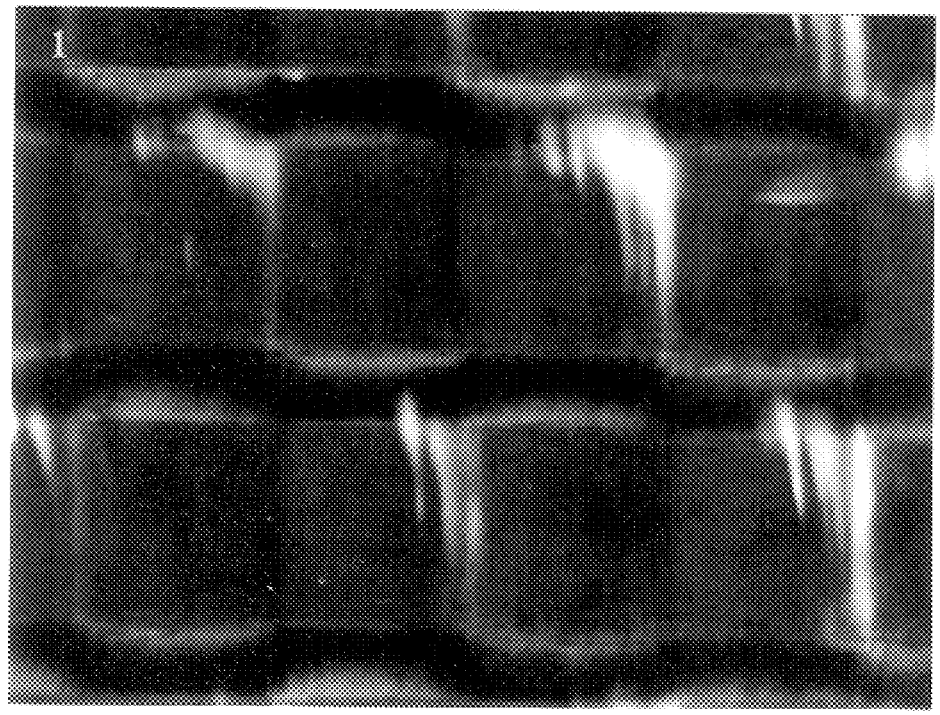

Glass samples were tested at pressures of 0, −5, −10, −15, −20 and −25 in/Hg. The resulting cured resin impregnated glass samples were photographed. The photographs are identified herein as FIGS. 5A–5F. FIG. 5A represents the sample impregnated at −25 in/Hg, FIG. 5B at −20 in/Hg, FIG. 5C at −15 in/Hg, FIG. 5D at −10 in/Hg, FIG. 5E at −5 in/Hg and FIG. 5F at ambient pressure. The Figures show that increasing the pressure differential experienced by the glass sample during resin impregnation significantly improves reduction of laminate voids to the point where the product depicted in FIG. 5B is essentially void free and the product depicted in FIG. 5A is void free.

EXAMPLE 2

This Example evaluated the ability of various processing steps of this invention to reduce laminate voids. The woven glass cloth used for each test is designated 7628 CS347 and is manufactured by Clark Schwebel. A control laminate was used as the baseline to evaluate the degree of wetout. Wetout is a measure of the ability of a solution to displace vapor in a fibrous substrate. A large wetout number means that more vapor in the substrate fibers is being displaced by liquid. High wetout numbers correlate to low cured substrate voids.

Table 1 below describes the recipes for the first resin solution which includes 30 wt % solids and for the second resin solution which includes 78 wt % solids. The substrate remained in the first, and, if applicable, the second resin solutions for 3–5 seconds. The impregnated substrates were cured at 330° F. for 3 minutes. The wet dwell time for all tests was 2 minutes.

TABLE 1

| Compound mg-Resin | Dip 1-30% solids | Dip 2- 78% solids |
|---|---|---|
| Dow 19053 Resin | 87.5 gr | 875 gr |
| Shell 1031 Resin | 1.8 gr | 18 gr |
| Shell 55BH30 Resin | 9.7 gr | 97 gr |
| DMF Solvent | 98.0 gr | 100 gr |
| Dicyandiamide Curing Agent | .95 gr | 9.5 gr |
| EMI Accelerator | .95 gr | 9.5 gr |
| Boric Acid Reactivity Controller | .19 gr | 1.9 gr |
| Acetone | 87 gr | 0 |

The resins used to manufacture each sample were identical except in some cases for the specific solvents used to dilute the resin. The solids content of the first and second dip resin solutions were held constant unless otherwise noted. The impregnated glass cloth curing conditions for the control and for the samples were identical. The processing variables, and wetout percentage for each sample are listed in Table 2 below. The control sample was dipped once in the second dip solution and cured identically to the other samples. With Sample E, Meir rods were positioned to cause the substrate to pass sequentially over each rod in a S-shaped path. The substrate in Sample H was worked manually in a mortar and pestle.

TABLE 2

| Sample | Description | 1st Dip (30% solids) | 2nd Dip (78% solids) | % Wetout |
|---|---|---|---|---|
| A | Control (78% solids) | No | Yes | 15* |
| B | Double Dip | Yes | Yes | 60 |
| C | Same as B + Heat resin to 110° F. in 1st dip | Yes | Yes | 75 |
| D | Same as B + 2 Meir rods to work web between dips | Yes | Yes | 85 |
| E | Same as C + 2 Meir rods to work web between dips | Yes | Yes | 95 |
| F | Same as B + Heat web between dips to 200° F. | Yes | Yes | 100 |
| G | Same as A + predry glass roll at 350° F. for 2 hours | No | Yes | 30 |
| H | Same as A + work the glass dry | No | Yes | 45 |
| I | First dip 10% solids | Yes** | Yes | 35 |
| J | First dip 20% solids | Yes** | Yes | 40 |
| K | First dip 40% solids | Yes** | Yes | 50 |
| L | First dip 50% solids | Yes** | Yes | 40 |
| M | First dip 60% solids | Yes** | Yes | 30 |
| N | First dip 72% solids | Yes** | Yes | 30 |
| O | 25% Acetone/75% DMF in both dips | Yes | Yes | 65 |
| P | 75% Acetone/25% DMF in both dips | Yes | Yes | 75 |
| Q | 50% Acetone/50% NMP in both dips | Yes | Yes | 80 |

*Standard process used as baseline @ 15% wetout
**First dip solids level as specified. Solids level adjusted by adding or omitting solvent.

Compared to the control (Sample A) each of the methods evaluated for reducing laminate voids improved the substrate wetout. The best wetout was 100% with Sample F where a double dipped substrate was heated to 200° F. for 2 minutes between dips. Other significant improvements in substrate wetout were obtained by heating the first dip resin to 110° F., by passing the substrate across two Meir rods in series between dips, and by using specific solvent combinations and preferably a 1:1 volume rate ratio of acetone to NMP.

What we claim is:

1. A method for manufacturing a cured resin impregnated essentially void free substrate comprising placing a substrate into a first impregnation zone including a solvent containing curable resin to produce a resin impregnated substrate and at least partially curing the resin impregnated substrate to produce a cured resin impregnated substrate, wherein the number of voids in the cured resin impregnated substrate are reduced by processing the substrate by at least one process step selected from the process steps consisting of (1) using a solvent containing curable resin having a relatively low solids content; (2) dipping the resin impregnated substrate into a second impregnation zone including a solvent containing curable resin having relatively high solids content; (3) mechanically manipulating the substrate by a Meir rod; (4) removing moisture from the substrate prior to placing the substrate into the first impregnation zone; (5) heating the solvent containing curable resin; and (6) heating the resin impregnated substrate before placing the resin impregnated substrate into a second impregnation step.

2. The method of claim 1 wherein the process step selected is dipping the resin impregnated substrate into a second impregnation zone including a solvent containing curable resin before curing the resin impregnated substrate.

3. The method of claim 2 wherein the solids content of the solvent containing curable resin in the first impregnation zone is less than the solids content of the solvent containing curable resin in the second impregnation zone.

4. The method of claim 2 wherein the first impregnation zone solvent containing curable resin has a solids content of from about 5 to about 50 wt %.

5. The method of claim 2 wherein the first impregnation zone solvent containing curable resin has a solids content of from about 10 to about 30 wt %.

6. The process of claim 2 wherein the resin impregnated substrate that is removed from the first impregnation zone is processed by a step selected from the process steps consisting of (a) removing at least a portion of a solvent from the resin impregnated substrate between the first and second impregnation zones; and (b) heating the resin impregnated substrate before the resin impregnated substrate is dipped into the second impregnation zone.

7. The process of claim 6 wherein the resin impregnated substrate is heated to a temperature of from about 100 to about 400° F.

8. The process of claim 1 wherein the processing step selected is mechanically manipulating the substrate.

9. The process of claim 8 wherein the substrate is manipulated at a point during the process selected from; before the substrate is placed into the first impregnation zone, in the first impregnation zone, following removal of the substrate from the first impregnation zone, in the second impregnation zone and combinations thereof.

10. The process of claim 8 wherein the substrate is mechanically manipulated by a method selected from an air knife, an ultrasonically, passing the substrate over a non-uniform surface, by passing the substrate between two rollers and by any combination thereof.

11. The process of claim 8 wherein the substrate changes directions as it passes across the Meir rod.

12. The process of claim 8 wherein the substrate is mechanically manipulated by passing the substrate between two rollers comprising a first roller having a first surface and a second roller having a second surface wherein the second roller surface is softer than the first roller surface.

13. The process of claim 1 wherein the processing step selected comprises heating the substrate prior to impregnation to render the substrate essentially moisture free.

14. The process of claim 13 wherein the substrate is heated to a temperature of from about 150 to about 500° F.

15. The process of claim 1 wherein the process step selected is heating the solvent containing resin in at least one impregnation zone.

16. The process of claim 15 wherein the solvent containing resin in the first impregnation zone is heated to a temperature of from about 80 to about 140° F.

17. A method for manufacturing a laminate comprising placing a substrate into at least one impregnation zone including a solvent containing curable resin to produce a resin impregnated substrate and at least partially curing the resin impregnated substrate to produce a cured resin impregnated substrate, and further including the step of forming a partial vacuum in the impregnation zone.

18. The method of claim 17 wherein the impregnation zone includes a single impregnation zone.

19. The method of claim 17 wherein the impregnation zone includes of at least two impregnation vessels wherein the substrate is passed through a first impregnation vessel into a vacuum chamber and then into a second impregnation vessel.

20. The method of claim 19 wherein the first impregnation vessel holds a solution selected from the group consisting of a solvent solution and a solvent containing curable resin solution.

21. The method of claim 19 wherein the second impregnation zone includes a solution that has a greater resin solids content than the solution in the first impregnation zone.

* * * * *